United States Patent
Sreenivasan et al.

(10) Patent No.: US 7,815,824 B2
(45) Date of Patent: Oct. 19, 2010

(54) REAL TIME IMPRINT PROCESS DIAGNOSTICS FOR DEFECTS

(75) Inventors: Sidlgata V. Sreenivasan, Austin, TX (US); Shrawan Singhal, Austin, TX (US); Byung-Jin Choi, Austin, TX (US)

(73) Assignees: Molecular Imprints, Inc., Austin, TX (US); Board of Regents, The University of Texas, Austin, TX (US)

( * ) Notice: Subject to any disclaimer, the term of this patent is extended or adjusted under 35 U.S.C. 154(b) by 32 days.

(21) Appl. No.: 12/392,663

(22) Filed: Feb. 25, 2009

(65) Prior Publication Data
US 2009/0214761 A1    Aug. 27, 2009

Related U.S. Application Data

(60) Provisional application No. 61/031,422, filed on Feb. 26, 2008.

(51) Int. Cl.
*B29C 45/76* (2006.01)
(52) U.S. Cl. ............... 264/40.1; 264/299; 264/319; 264/284; 264/293; 256/237.4; 256/237.5; 256/237.1; 256/237.3; 425/385
(58) Field of Classification Search .......... 264/40.1, 264/299, 319, 284, 293; 356/237.4–237.5, 356/237.1, 237.3; 425/385
See application file for complete search history.

(56) References Cited

U.S. PATENT DOCUMENTS

| | | | |
|---|---|---|---|
| 7,060,402 B2 | 6/2006 | Choi et al. | |
| 7,132,225 B2 | 11/2006 | Voisin | |
| 7,433,040 B2 | 10/2008 | Mieher et al. | |
| 2004/0117055 A1* | 6/2004 | Seidel et al. | 700/121 |
| 2006/0076717 A1* | 4/2006 | Sreenivasan et al. | 264/494 |
| 2007/0046705 A1* | 3/2007 | Wong et al. | 347/14 |
| 2007/0070338 A1* | 3/2007 | Tanaka et al. | 356/237.5 |
| 2007/0246850 A1 | 10/2007 | Schumaker | |
| 2008/0026305 A1 | 1/2008 | Wu et al. | |
| 2008/0308971 A1* | 12/2008 | Liu et al. | 264/293 |

OTHER PUBLICATIONS

Song; Study of demolding process in thermal imprint lithography via numerical simulation and experimental approaches; Thesis Submitted to Graduate Faculty of the Louisiana State University Agricultural and Mechanical College USA; Dec. 1, 2007.

* cited by examiner

*Primary Examiner*—Khanh Nguyen
*Assistant Examiner*—Saeed M Huda
(74) *Attorney, Agent, or Firm*—Laura C. Robinson

(57) ABSTRACT

Defects and/or particles during an imprint lithography process may provide exclusion zones and/or transition zones in the patterned layer. Exclusion zones and/or transition zones in the patterned layer may be identified to provide a region of interest on a template.

8 Claims, 5 Drawing Sheets

US 7,815,824 B2

REAL TIME IMPRINT PROCESS DIAGNOSTICS FOR DEFECTS

CROSS-REFERENCE TO RELATED APPLICATIONS

This application claims the benefit under 35 U.S.C. §119 (e)(1) of U.S. Provisional No. 61/031,422, filed on Feb. 26, 2008, which is hereby incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
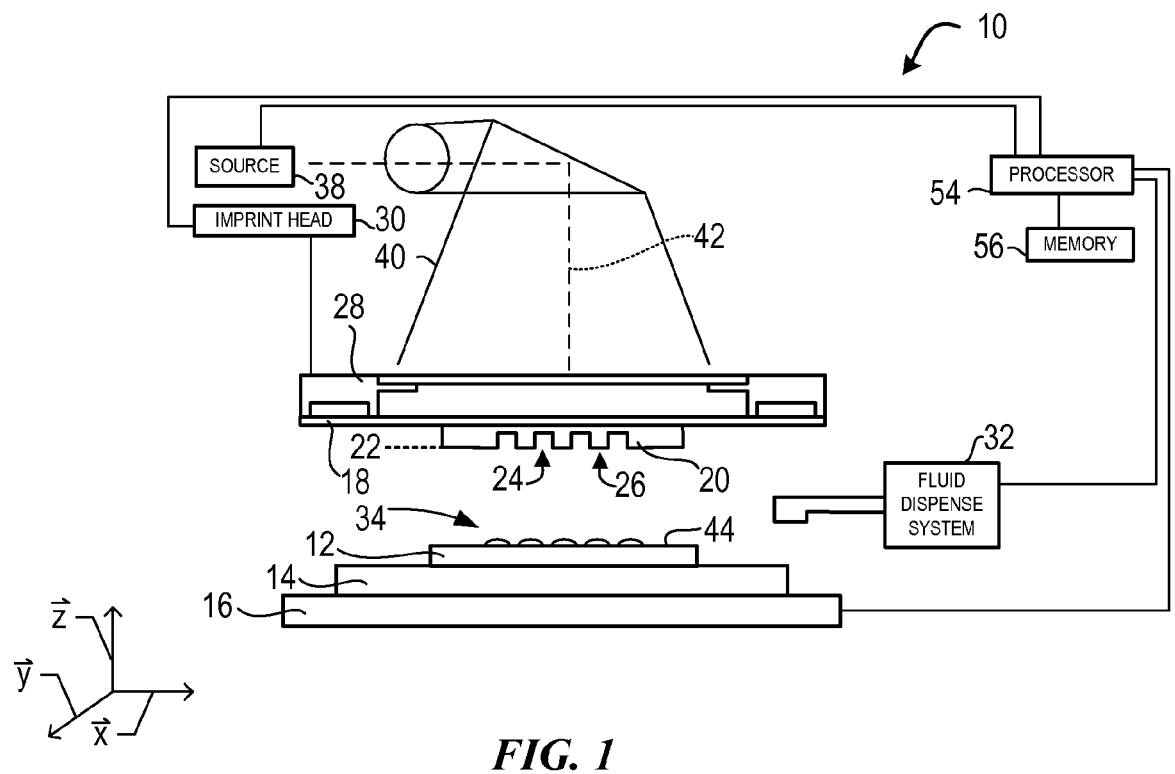
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon substrate 12 using techniques such as those described in U.S. Patent Publication No. 2005/0270312 and U.S. Patent Publication No. 2005/0106321, both of which are hereby incorporated by reference herein. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
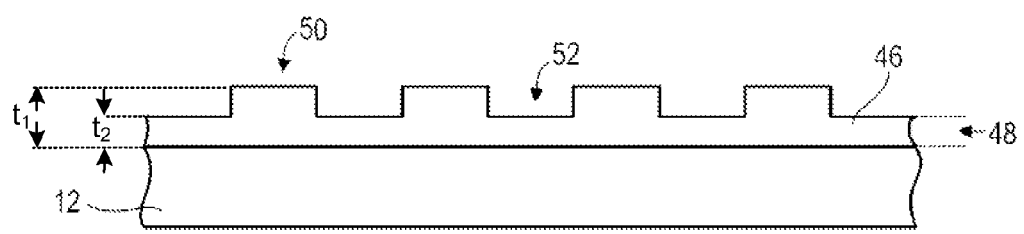
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, all of which are hereby incorporated by reference herein.

Referring to FIGS. 1, 2, 3 and 4, during the patterning process, a particle 60 may become positioned between substrate 12 and template 18 and may result in damage to template 18, substrate 12 and/or patterned layer 46. Particle 60 may have a thickness $t_3$. If the thickness $t_3$ of particle 60 is less than thickness $t_2$ of a portion of residual layer 48, there may be minimal or no contact between particle 60 and template 18. Minimal or no contact between particle 60 and template 18 may reduce the occurrence of damage to template 18 and/or the resulting patterned layer 46 in the presence of particle 60.

In some circumstances, however, thickness $t_3$ of particle 60 may be greater than thickness $t_2$ of at least a portion of residual layer 48. For example, thickness $t_3$ of particle 60 may be between approximately 10 nm-2 μm or greater. The presence of particle 60 having such a thickness $t_3$ may damage and/or deform template 18, substrate 12 and/or patterned layer 48. For example, particle 60 having a thickness $t_3$ of approximately 10 μm may cause damage to template 18 upon contact of template 18 with polymerizable material 34 and/or particle 60.

The effective height $P_{EFF}$ of particle 60 may be defined as:

$$P_{EFF} = t_3 - t_2 \quad [EQ. 1]$$

If the effective particle height $P_{EFF}$ of particle 60 is small, it may be difficult to detect the presence of particle 60 during the patterning process. For example, it may be difficult to detect the presence of particle 60 prior to contact between template 18 and polymerizable material 34 if the effective particle height $P_{EFF}$ is less than approximately 100 nm. As such, detection of particle 60 may be in-situ or post imprint using the following systems and methods.

Figure 3:
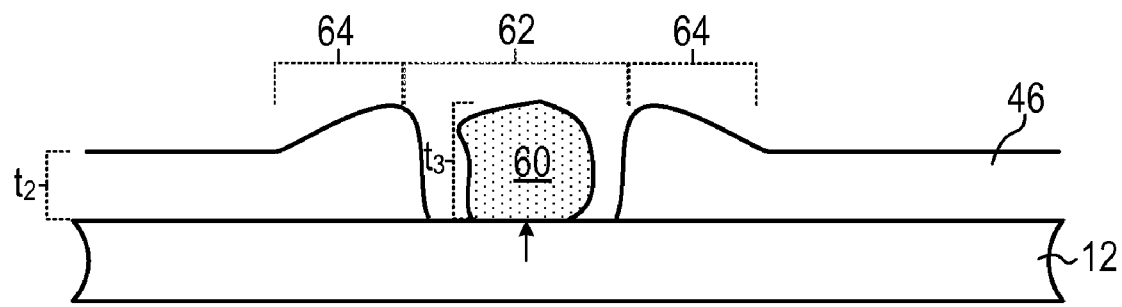
FIGS. 3 and 4 illustrate simplified side views of a substrate having a particle positioned thereon.
Figure 4:
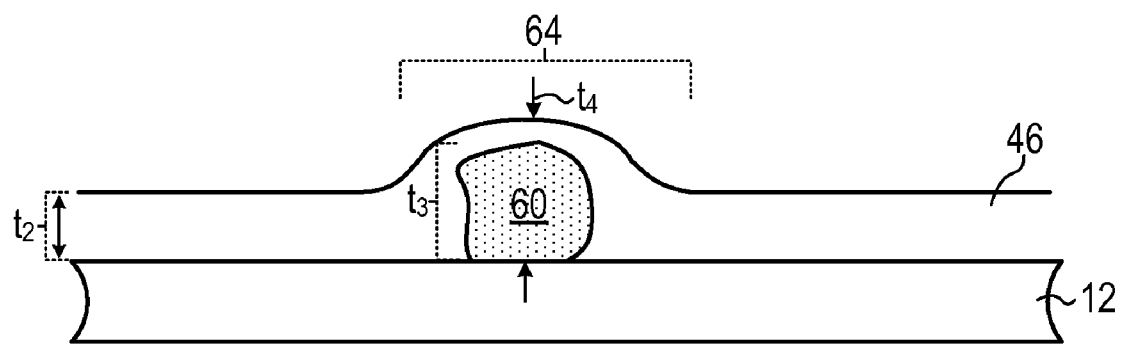

Referring to FIGS. 2, 3 and 4, upon formation of patterned layer 46, particle 60 may create an exclusion zone 62 and/or a transition zone 64 between template 18 and substrate 12. Exclusion zone 62 may be defined as an area surrounding particle 60 substantially absent of polymerizable material 34 as shown in FIG. 3. Transition zone 64 may be defined as an area of polymerizable material 34 having a thickness $t_4$ greater than thickness $t_3$ of residual layer 48 as shown in FIGS. 3 and 4.

Figure 5A:
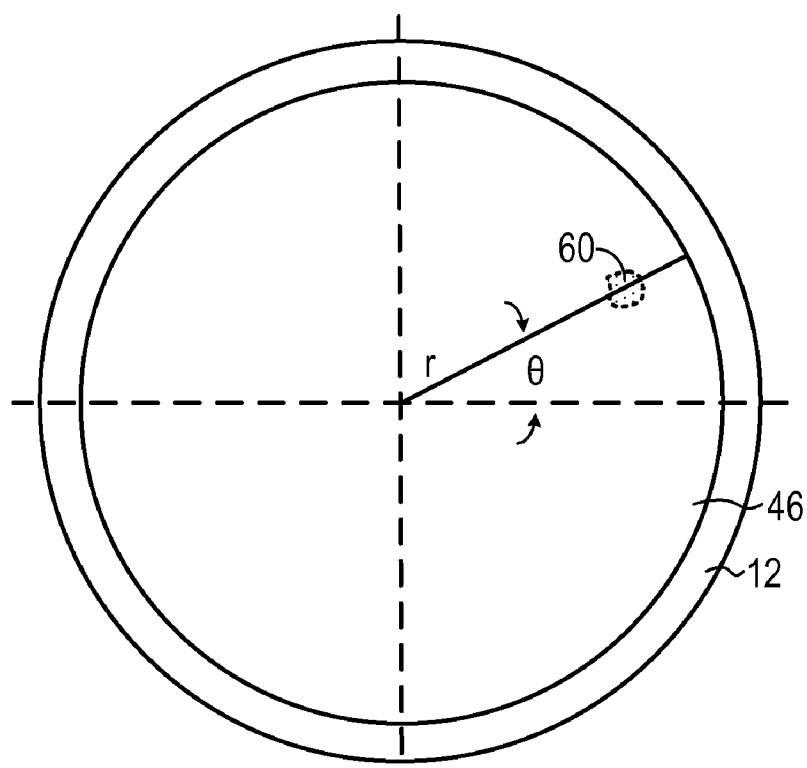
FIG. 5A illustrates a top down view of a substrate having a particle positioned thereon.
Figure 5B:
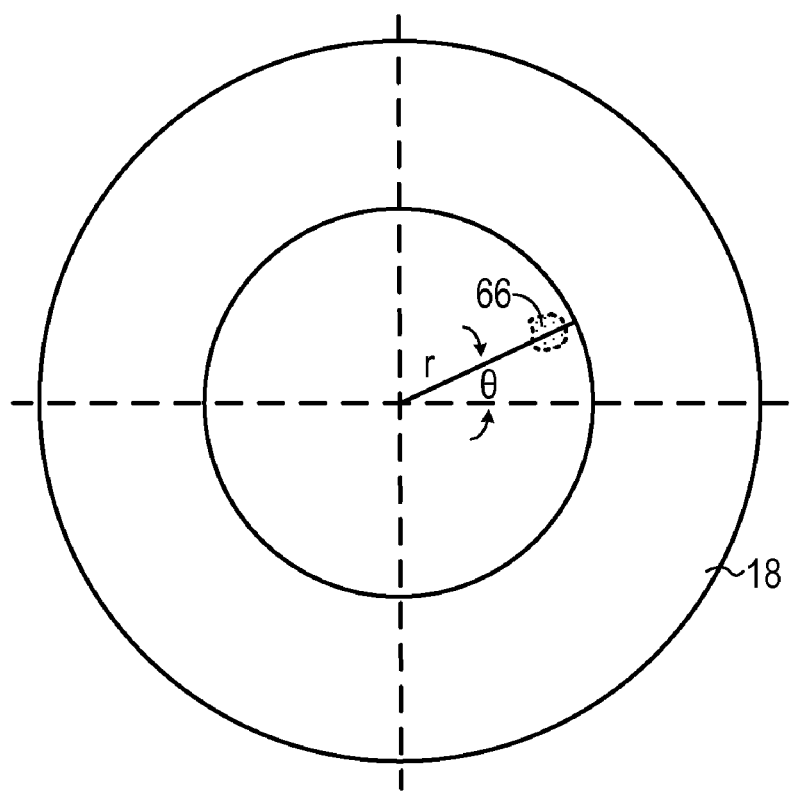
FIG. 5B illustrates a top down view of a template having a region of interest.
Figure 6:
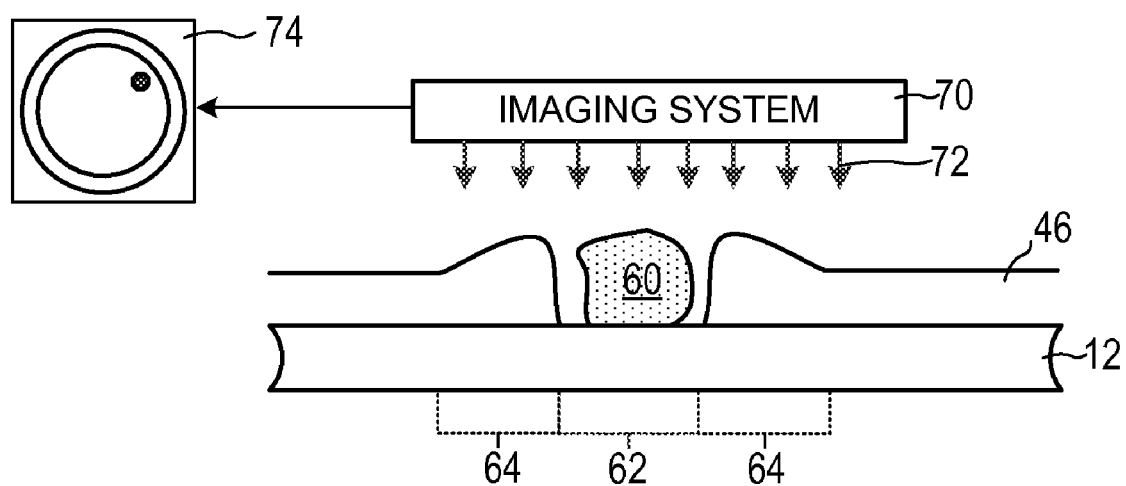
FIG. 6 illustrates a simplified side view of an imaging system in accordance with an embodiment of the present invention.

Referring to FIGS. 5A, 5B and 6, identification of exclusion zone 62 and/or transition zone 64 on substrate 12 may aid in inspection of template 18 for damage and/or deformation during and/or subsequent to the contact of template 18 and polymerizable material 34. For example, as illustrated in FIGS. 5A and 5B, exclusion zone 62 may correspond to a sub-region of template 18 hereinafter referred to as a region of interest 66. The region of interest 66 on template 18 may be inspected for damage that may be caused by contact of template 18 to particle 60 and/or polymerizable material 34.

As illustrated in FIG. 6, an image system 70 may provide in-situ imaging of exclusion zones 62 and/or transition zones 64 between template 18 and substrate 12. Imaging of exclusion zone 62 may be through template 18 and/or substrate 12. For example, imaging of exclusion zone 62 may be directly to substrate 12 without template 18. Image system 70 may include a CCD camera or CMOS camera, sensors, and/or other similar imaging camera and/or apparatus that may be capable of sensing and/or imaging in-situ template 18, substrate 12, and/or polymerizable material 34. It should be noted that lens and/or optical shifters may be incorporated into the design of image system 70 as needed based on design considerations. Exemplary image systems 70 are further described in detail in U.S. Pat. Nos. 7,019,835, 6,871,558, 6,990,870, 7,036,389, 6,916,584, 7,070,405, 6,908,861, U.S. Ser. No. 11/737,301 and/or the like, which are hereby incorporated by references in their entirety herein.

Referring to FIGS. 5A, 5B, and 6, determination of the region of interest 66 of template 18 may be through identification of the geometry of exclusion zone 62 and/or transition zone 64. Region of interest 66 may correspond directly to exclusion zone 62 and/or transition zone 64. For example, exclusion zone 62 may be approximately 2 nm and the corresponding region of interest 66 may similarly be approximately 2 nm. Geometric analysis of the pattern provided by exclusion zone 62 and/or transition zone 64 may further reduce the size of the corresponding region of interest 66. Based on the geometric analysis of the shape of exclusion zone 62 and/or transition zone 64, a defined area within exclusion zone 62 and/or transition zone 64 may be used to provide the corresponding region of interest 66 having a reduce size as compared to the entire exclusion zone 82 and/or transition zone 64. For example, exclusion zone 62 having a circular geometry with a diameter of approximately 5 nm may have a defect near the center. As such, the region of interest 66 may correspond to a 1 nm diameter circular region located in the approximate center of exclusion zone 62 as compared to the entire exclusion zone 62. Geometric analysis may rely on prior defect analysis and/or pattern recognition.

Identification of the geometry of exclusion zone 62 and/or transition zone 64 may be provided by using image system 70. Image system 70 may be positioned in a line of sight 72 of template 18 and/or substrate 12. Image system 70 may provide an image 74 of the geometry of exclusion zone 62 and/or transition zone 64. Based on the geometry of exclusion zone 62 and/or transition zone 64, region of interest 66 may be determined on template 18.

As illustrated in FIGS. 5A and 5B, region of interest 66 may be identified by polar coordinates (r, θ). It should be noted that region of interest 66 may be identified by any coordinate system including, but not limited to, the Cartesian coordinate system.

Identification of particles 60 and/or defects using the systems and methods described herein may provide for substantially continuous operation of system 10. For example, particle 60 and/or defects may be identified on a first template 18. The first template 18 may be unloaded from the system 10 for a selected area inspection directed to region of interest 66. During this time, a second template 18 may be loaded within system 10 and used for patterning. Once the defect and/or particle 60 is identified and/or removed from the first template 18, the first template 18 may be reloaded in system 10. For example, the first template 18 may be reloaded in system 10 if a defect and/or particle 60 is identified on the second template 18.

As particles 60 and/or defects are identified on template 18, a determination may be made on whether such particles 60 and/or defects are untreatable and unacceptable for further use, untreatable but acceptable for further use or treatable. Such a determination may provide for whether to discard template (e.g., untreatable and unacceptable for further use), remove/repair particles 60 and/or defects and reload template 18 into system 10 (treatable), or reload template 18 with particles 60 and/or defects (untreatable but acceptable for further use).

Figure 7:
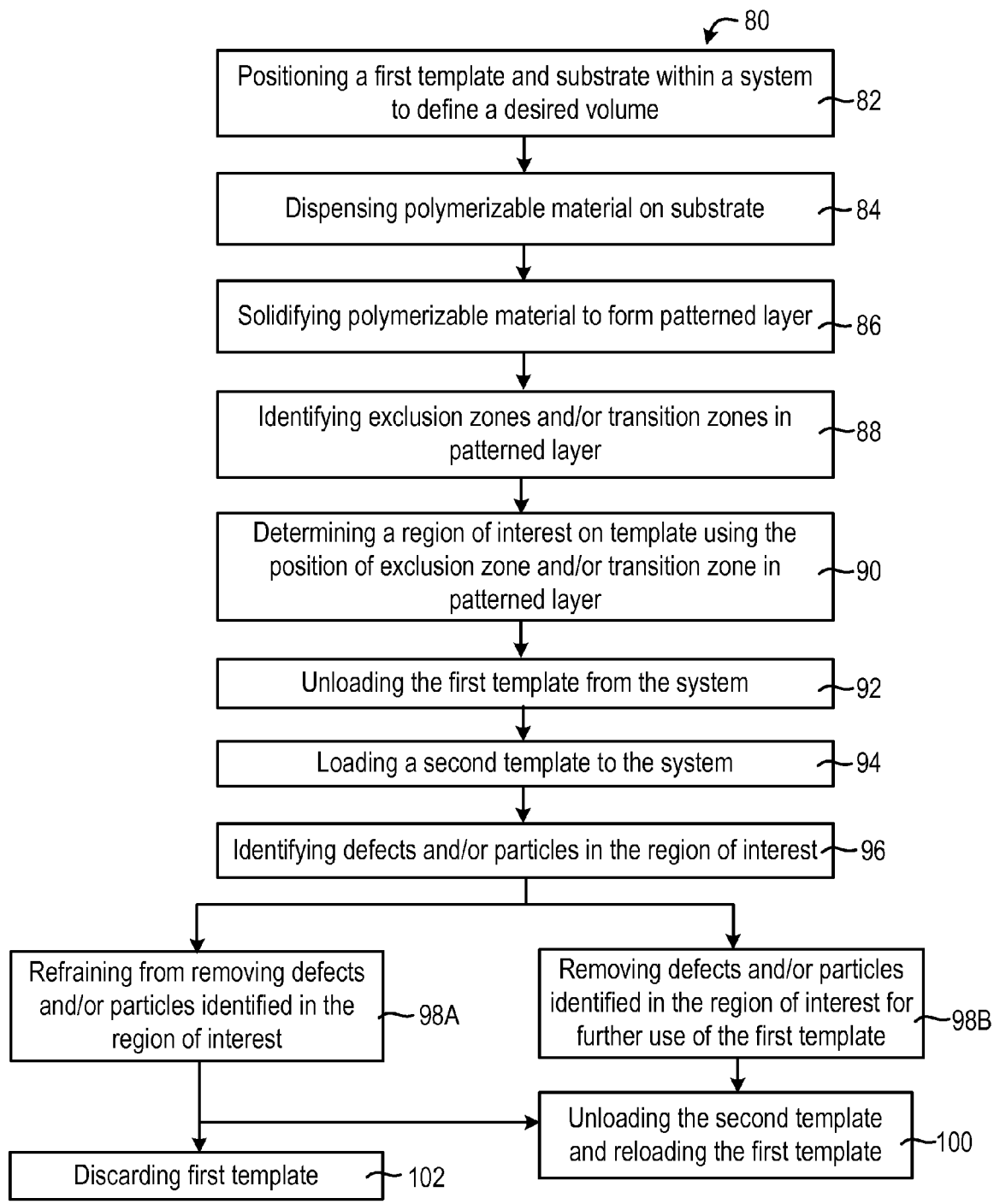
FIG. 7 illustrates a flow chart of a method for in situ detection of defects and/or particles.

FIG. 7 illustrates a flow chart of a method 80 for in situ detecting of defects and/or particle 60. In a step 82, a first template 18 and substrate 12 may be positioned to define a desired volume therebetween capable of being filled by polymerizable material 34. In a step 84, polymerizable material 34 may be dispensed on substrate 12. In a step 86, source 38 may produce energy 40, e.g., ultraviolet radiation, causing polymerizable material 34 to solidify and/or cross-link conforming to a shape of surface 44 of substrate 12 and patterning surface 22, defining patterned layer 46 on substrate 12. In a step 88, exclusion zone 62 and/or transition zone 64 may be identified in patterned layer 46. For example, positioning of exclusion zone 62 and/or transition zone 64 may be identified using imaging system 70. In a step 90, region of interest 66 on the first template 18 may be determined using the position of exclusion zone 62 and/or transition zone 64. In a step 92, the first template 18 may be unloaded from system 10. In a step 94, a second template 18 may be loaded into system 10. In a step 96, the first template 18 may be inspected for defects and/or particle in region of interest 66. Identification of defect may lead to the determination that such particles and/or defects are untreatable and unacceptable for further use, untreatable but acceptable for further use, or treatable. Such a determination may provide for whether to refrain from removing particles 60 and/or defects (i.e. step 98a) or remove particles 60 and/or defects (i.e., step 98b). It should also be noted that some particles 60 and/or defects may be removed while some remain. Particles 60 and/or defects determined to be untreatable and unacceptable for further use may be discarded, as shown in step 102. For particles and/or defects determined to be untreatable but acceptable for further use, second template 18 may be unloaded from system 10 and first template 18 reloaded. Additionally, for treatable particles 60 and/or defects, after removal of the particle 60 and/or defect, second template 18 may be unloaded from system 10 and first template 18 reloaded.

It should be noted that the above described systems and methods may be used in any imprint application. For example, the systems and methods described herein may be used in imprinting process including, but not limited to, patterned media imprinting, whole wafer imprinting, CMOS imprinting, and the like.

What is claimed is:

1. A method comprising:
    loading a first template in an imprint lithography system, the first template being positioned to define a volume between the first template and a first substrate;
    patterning polymerizable material between the first template and the first substrate to provide a patterned layer, the patterned layer having a residual layer and a plurality of features;
    identifying an exclusion zone and a transition zone in the patterned layer;
    determining a region of interest on the first template, the region of interest corresponding to the exclusion zone and the transition zone in the patterned layer;
    removing the first template from the imprint lithography system;
    loading a second template into the imprint lithography system;
    patterning polymerizable material between the second template and a second substrate;
    removing a defect from the first template; and,
    unloading the second template from the imprint lithography system and reloading the first template.

2. The method of claim 1, wherein the exclusion zone and the transition zone are identified using an imaging system.

3. The method of claim 2, wherein the imaging system includes at least one CCD camera.

4. The method of claim 1, further comprising determining a pre-set limit for the magnitude of thickness of the residual layer, wherein identifying the transition zone includes determining variation of the magnitude of thickness of the residual layer as compared to the pre-set limit.

5. The method of claim 1, wherein the template is an imprint lithography template for whole wafer imprinting.

6. The method of claim 1, wherein the template is an imprint lithography template for patterned media imprinting.

7. The method of claim 1, wherein the template is an imprint lithography template for CMOS imprinting.

8. A method comprising:
    positioning a first template and a substrate within an imprint lithographic system to define a volume therebetween;
    dispensing polymerizable material on the substrate;
    solidifying the polymerizable material to define a patterned layer on the substrate;
    identifying a position of at least one transition zone in the patterned layer, the patterned layer including a residual layer having a magnitude of thickness;
    determining a region of interest on the first template based on the position of the transition zone;
    unloading the first template from the imprint lithographic system; and,
    identifying and defects within the region of interest;
    determining acceptability of the defect and ability of the defect to be repaired;
    selecting, based on the acceptability of the defect and the ability of the defect to be repaired, one of:
    repairing the defect and reloading the first template,
    reloading the first template without repairing the defect, or discarding the template.

* * * * *